US010181822B2

(12) United States Patent
Shounai et al.

(10) Patent No.: US 10,181,822 B2
(45) Date of Patent: Jan. 15, 2019

(54) POWER AMPLIFIER MODULE

(71) Applicant: Murata Manufacturing Co., Ltd., Kyoto (JP)

(72) Inventors: Hiroki Shounai, Kyoto (JP); Yoshiki Kogushi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/958,167

(22) Filed: Apr. 20, 2018

(65) Prior Publication Data
US 2018/0241355 A1 Aug. 23, 2018

Related U.S. Application Data

(63) Continuation of application No. 15/586,367, filed on May 4, 2017, now Pat. No. 9,979,357.

(30) Foreign Application Priority Data

May 19, 2016 (JP) .................. 2016-100524

(51) Int. Cl.
H03F 1/26 (2006.01)
H03F 3/24 (2006.01)
H03F 1/32 (2006.01)
H03F 3/195 (2006.01)
H03F 1/56 (2006.01)
H03F 3/213 (2006.01)

(52) U.S. Cl.
CPC ............ *H03F 1/26* (2013.01); *H03F 1/32* (2013.01); *H03F 1/565* (2013.01); *H03F 3/195* (2013.01); *H03F 3/213* (2013.01); *H03F 3/245* (2013.01); *H03F 2200/171* (2013.01); *H03F 2200/387* (2013.01); *H03F 2200/451* (2013.01)

(58) Field of Classification Search
CPC ........................................ H03F 1/26
See application file for complete search history.

(56) References Cited

U.S. PATENT DOCUMENTS

| 5,105,172 | A | 4/1992 | Khatibzadeh |
| 6,157,258 | A | 12/2000 | Adishian |
| 6,177,841 | B1 | 1/2001 | Ohta |
| 7,202,734 | B1 | 4/2007 | Raab |
| 7,764,125 | B2 * | 7/2010 | Dawe ................ H03F 1/56 330/302 |

(Continued)

FOREIGN PATENT DOCUMENTS

| JP | H10-145147 A | 5/1998 |
| JP | 2000-106510 A | 4/2000 |

(Continued)

*Primary Examiner* — Patricia T Nguyen
(74) *Attorney, Agent, or Firm* — Pearne & Gordon LLP

(57) ABSTRACT

A power amplifier module includes an amplifier that amplifies an input signal and outputs an amplified signal, a matching circuit disposed between an output terminal of the amplifier and a subsequent circuit, a choke inductor having a first end to which a power supply voltage is applied and a second end from which power supply is provided to the amplifier through the output terminal of the amplifier, and a first attenuation circuit disposed between the output terminal of the amplifier and the second end of the choke inductor and configured to attenuate a harmonic component of the amplified signal.

10 Claims, 16 Drawing Sheets

(56) References Cited

U.S. PATENT DOCUMENTS

| | | |
|---|---|---|
| 2002/0101284 A1 | 8/2002 | Kee |
| 2008/0094142 A1 | 4/2008 | Kawashima et al. |
| 2013/0223565 A1* | 8/2013 | McCallister ...... H04L 25/03343 |
| | | 375/297 |
| 2015/0031318 A1 | 1/2015 | McCallister |
| 2015/0091656 A1* | 4/2015 | Gaynor ................... H03F 3/72 |
| | | 330/302 |
| 2015/0091657 A1* | 4/2015 | Gaynor ................... H03F 3/21 |
| | | 330/302 |
| 2015/0357989 A1* | 12/2015 | Ma .......................... H03H 7/38 |
| | | 455/572 |
| 2015/0365057 A1 | 12/2015 | Kaczman |

FOREIGN PATENT DOCUMENTS

| | | |
|---|---|---|
| JP | 2005-341446 A | 12/2005 |
| JP | 2008-103874 A | 5/2008 |

* cited by examiner

POWER AMPLIFIER MODULE

This is a continuation of U.S. patent application Ser. No. 15/586,367 filed on May 4, 2017, which claims priority from Japanese Patent Application No. 2016-100524 filed on May 19, 2016. The content of each of these applications is incorporated herein by reference in its entirety.

BACKGROUND

The present disclosure relates to a power amplifier module. A mobile terminal that uses a communication network for cellular phones includes a power amplifier module for amplifying power of a radio-frequency (RF) signal to be transmitted to a base station. In the power amplifier module, a resonant circuit is used to attenuate a harmonic component of an amplified signal to be output from an amplifier (a signal having a frequency that is an integer multiple of the fundamental frequency of the amplified signal). For example, Japanese Unexamined Patent Application Publication No. 10-145147 discloses a configuration in which harmonic termination circuits (resonant circuits) are disposed between an output terminal of an amplifier and an output terminal of a high-frequency amplifier circuit.

A matching circuit is typically disposed between an output terminal of an amplifier and an output terminal of a power amplifier module to provide impedance matching between the amplifier and the subsequent circuit. In this configuration, if the matching circuit includes a harmonic termination circuit as disclosed in Japanese Unexamined Patent Application Publication No. 10-145147, signal loss within the matching circuit may increase due to the influence of the frequency characteristics of the harmonic termination circuit.

BRIEF SUMMARY

Accordingly, the present disclosure provides a power amplifier module that is configured to attenuate harmonic components and to eliminate or reduce the loss of a fundamental component.

A power amplifier module according to embodiments of the present disclosure includes an amplifier that amplifies an input signal and outputs an amplified signal, a matching circuit disposed between an output terminal of the amplifier and a subsequent circuit, a choke inductor having a first end to which a power supply voltage is applied and a second end from which power supply is provided to the amplifier through the output terminal of the amplifier, and a first attenuation circuit disposed between the output terminal of the amplifier and the second end of the choke inductor, the first attenuation circuit attenuating a harmonic component of the amplified signal.

According to embodiments of the present disclosure, it is possible for a power amplifier module to attenuate harmonic components and to eliminate or reduce the loss of a fundamental component.

Other features, elements, characteristics and advantages of the present disclosure will become more apparent from the following detailed description of embodiments of the present disclosure with reference to the attached drawings.

DETAILED DESCRIPTION

Figure 1:
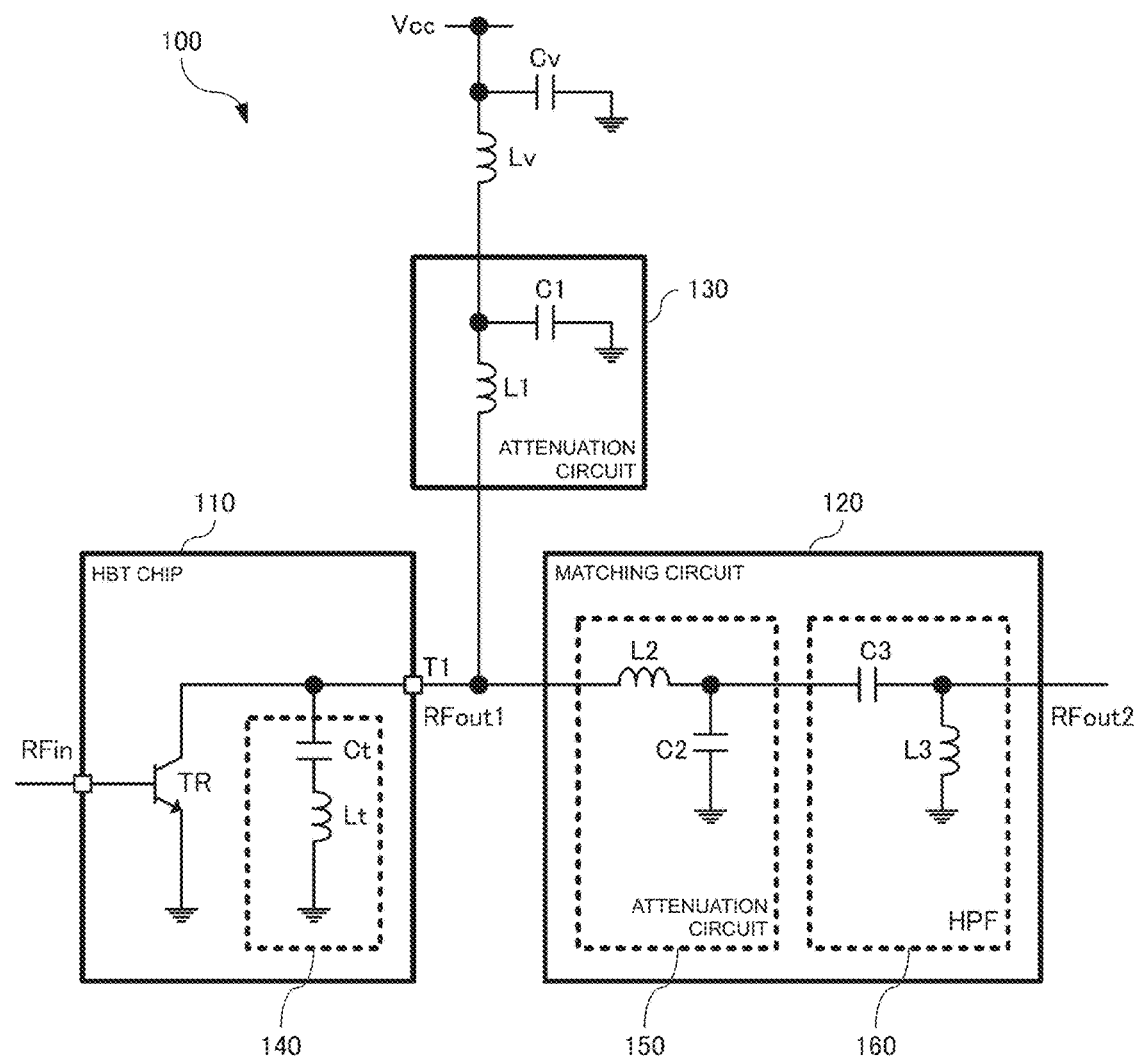
FIG. 1 illustrates a configuration of a power amplifier module according to an embodiment of the present disclosure.

An embodiment of the present disclosure will be described hereinafter with reference to the drawings. FIG. 1 illustrates a configuration of a power amplifier module 100 according to an embodiment of the present disclosure. The power amplifier module 100 is a module that amplifies a radio-frequency (RF) signal (RFin) and outputs the amplified signal (RFout2). The power amplifier module 100 includes, for example, a heterojunction bipolar transistor (HBT) chip 110, a matching circuit 120, a choke inductor Lv, a capacitor Cv, and an attenuation circuit 130. The configuration of the power amplifier module 100 is not limited to the configuration illustrated in FIG. 1, and the power amplifier module 100 may have any other configuration.

The HBT chip 110 (first chip) is a chip having integrated elements including an HBT. In the following, an HBT is sometimes referred to simply as a "transistor". The HBT chip 110 includes a transistor TR and a harmonic termination circuit 140.

The transistor TR (amplifier) has an emitter grounded, a collector (output terminal) connected to a terminal T1, and a base to which an RF signal RFin is input. An amplified signal RFout1, which is obtained by amplifying the RF signal RFin (input signal), is output from the collector of the transistor TR. The harmonic termination circuit 140 (third attenuation circuit) attenuates a harmonic component (for example, the second harmonic) included in the amplified signal RFout1. The harmonic termination circuit 140 includes, for example, a capacitor Ct and an inductor Lt, which are connected in series. As illustrated in FIG. 1, the harmonic termination circuit 140 has one end connected to the collector of the transistor TR, and another end grounded.

The configuration of the HBT chip 110 is not limited to the configuration illustrated in FIG. 1, and the HBT chip 110 may have any other configuration. For example, the HBT chip 110 may include a plurality of stages of amplifiers. The HBT chip 110 may further include a bias circuit that supplies a bias current or a bias voltage to the transistor TR. In addition, the harmonic component to be attenuated by the harmonic termination circuit 140 is not limited to the second harmonic and may be a third or higher order harmonic component. Furthermore, the HBT chip 110 may not necessarily include the harmonic termination circuit 140. However, since, among the harmonic components included in the amplified signal RFout1, the energy of the second harmonic is particularly high, it is effective to attenuate the second harmonic at a position close to the collector (output terminal) of the transistor TR by using the harmonic termination circuit 140. In this embodiment, furthermore, an HBT is used as a transistor constituting an amplifier; however, the transistor is not limited to a bipolar transistor and may be a field-effect transistor (FET).

The matching circuit 120 is disposed between the transistor TR and the subsequent circuit (for example, a switch circuit) to match the output impedance of the transistor TR and the input impedance of the subsequent circuit. The matching circuit 120 includes an attenuation circuit 150 and a high-pass filter (HPF) 160. The amplified signal RFout1 output from the HBT chip 110 is output as an amplified signal RFout2 through the matching circuit 120.

The attenuation circuit 150 (second attenuation circuit) attenuates a harmonic component (for example, the second harmonic) included in the amplified signal RFout1. The attenuation circuit 150 includes, for example, an inductor L2 (second inductor) and a capacitor C2 (second capacitor). The inductor L2 has an end connected to the terminal T1 of the HBT chip 110. The capacitor C2 has one end connected to another end of the inductor L2, and another end grounded. The harmonic component to be attenuated by the attenuation circuit 150 is not limited to the second harmonic and may be a third or higher order harmonic component.

The HPF 160 attenuates components having frequencies lower than a predetermined cutoff frequency which are included in the amplified signal RFout1. The cutoff frequency is lower than the frequency of the third harmonic of the amplified signal RFout1, for example. The HPF 160 includes, for example, a capacitor C3 (third capacitor) and an inductor L3 (third inductor). The capacitor C3 has an end connected to the other end of the inductor L2. The inductor L3 has one end connected to another end of the capacitor C3, and another end grounded. The amplified signal RFout2 is output from the other end of the capacitor C3. The capacitor C3 also serves as a direct current (DC) cut capacitor that removes the DC component of the amplified signal RFout1.

The choke inductor Lv has one end to which a power supply voltage Vcc is applied, and another end from which power supply is provided to the transistor TR through the collector of the transistor TR. The capacitor Cv has one end connected to the one end of the inductor Lv, and another end grounded.

The attenuation circuit 130 (first attenuation circuit) attenuates a harmonic component (for example, the third harmonic) included in the amplified signal RFout1. The attenuation circuit 130 is disposed between the other end of the inductor Lv and the collector of the transistor TR. The attenuation circuit 130 includes, for example, an inductor L1 (first inductor) and a capacitor C1 (first capacitor). The inductor L1 has one end connected to the collector of the transistor TR via the terminal T1, and another end connected to the other end of the choke inductor Lv. The capacitor C1 has one end connected to the other end of the inductor L1, and another end grounded. The inductance of the choke inductor Lv is much greater than the inductance of the inductor L1. Hence, the input impedance of the choke inductor Lv, as viewed from the other end of the inductor L1, can be regarded as being open in terms of a specific frequency range. Accordingly, the inductor L1 and the capacitor C1 form a series resonant circuit for attenuating a harmonic component (for example, the third harmonic) included in the amplified signal RFout1. The harmonic component to be attenuated by the attenuation circuit 130 is not limited to the third harmonic and may be the second harmonic or a fourth or higher order harmonic component.

The power amplifier module 100 includes the attenuation circuit 130 that attenuates a harmonic component (for example, the third harmonic). This configuration allows the power amplifier module 100 to attenuate the harmonic component of the amplified signal RFout1. In the power amplifier module 100, the attenuation circuit 130 is disposed between the terminal T1 of the HBT chip 110 and the choke inductor Lv rather than within the matching circuit 120. This configuration allows the power amplifier module 100 to eliminate or reduce the loss of a fundamental component, compared with a configuration in which a harmonic termination circuit for attenuating a harmonic component (for example, the third harmonic) is disposed within the matching circuit 120.

Figure 2:
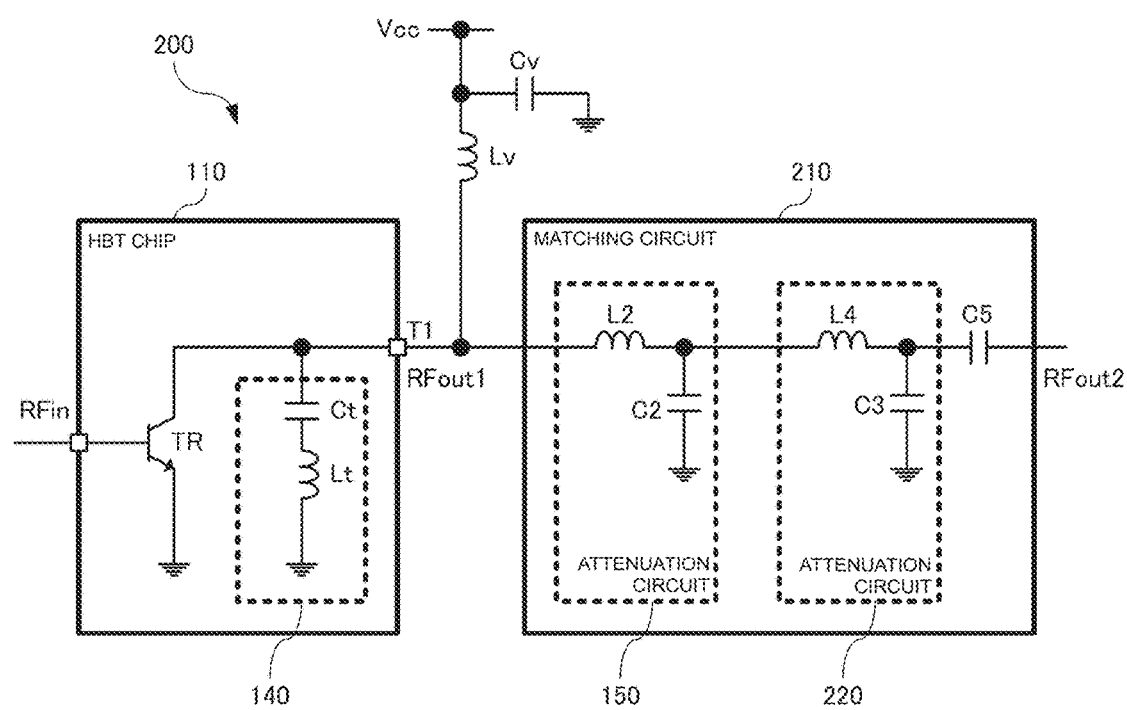
FIG. 2 illustrates a configuration of a power amplifier module according to a first comparative example.

FIG. 2 illustrates a configuration of a power amplifier module 200 according to a first comparative example (hereinafter referred to as the first comparative example 200) for comparison with the power amplifier module 100. Elements equivalent to those of the power amplifier module 100 are assigned equivalent numerals and are not described herein. The first comparative example 200 does not include the attenuation circuit 130 of the power amplifier module 100. The first comparative example 200 includes a matching circuit 210 in place of the matching circuit 120 of the power amplifier module 100. The matching circuit 210 includes an attenuation circuit 220 in place of the HPF 160 in the matching circuit 120 of the power amplifier module 100. The matching circuit 210 further includes a capacitor C5.

The attenuation circuit 220 attenuates a harmonic component (for example, the third harmonic) included in the amplified signal RFout1. The attenuation circuit 220 includes, for example, an inductor L4 and a capacitor C3. The inductor L4 has one end connected to the other end of the inductor L2, and another end connected to one end of the capacitor C5. The capacitor C3 has one end connected to the other end of the inductor L4, and another end grounded. An amplified signal RFout2 from which the DC component has been removed is output from another end of the capacitor C5.

In the first comparative example 200 illustrated in FIG. 2, the attenuation circuit 220 disposed in the matching circuit 210, instead of the attenuation circuit 130 of the power amplifier module 100, can attenuate a harmonic component (for example, the third harmonic) included in the amplified signal RFout1. However, the configuration of the power amplifier module 100 enables the power amplifier module 100 to support a wider frequency band than that with the configuration of the first comparative example 200. A description of this point will be made.

Each of the attenuation circuits 150 and 220 includes an inductor connected in series with a signal path and a capacitor shunt connected across the signal path and is a circuit of a low-pass filter (LPF) type. In contrast, the HPF 160 includes a capacitor connected in series with a signal path and an inductor shunt connected across the signal path and is a circuit of an HPF type.

Figure 3:
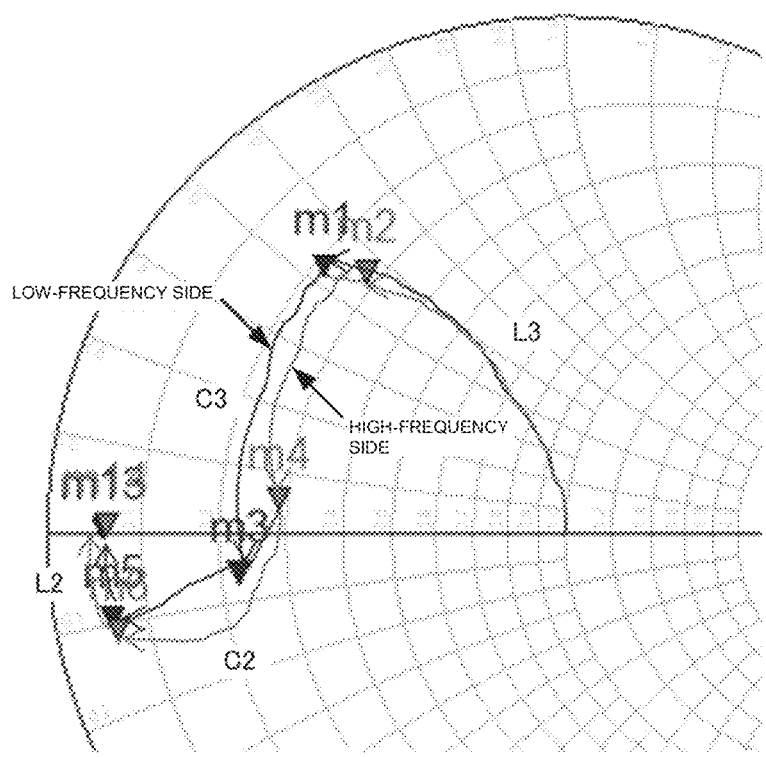
FIG. 3 illustrates impedance loci in a matching circuit of the power amplifier module illustrated in FIG. 1.

FIG. 3 illustrates impedance loci in the matching circuit 120 of the power amplifier module 100 when plotted on a Smith chart. FIG. 3 depicts the loci of the impedance of the inductor L3, the capacitor C3, the capacitor C2, and the inductor L2 (on the low-frequency side and the high-frequency side) from the center (50Ω) of the Smith chart. As illustrated in FIG. 3, in the HPF 160 (the capacitor C3 and the inductor L3), which is of the HPF type, the connection between the capacitor C3 and the inductor L3 permits a larger movement (change) of the impedance on the low-frequency side than the impedance on the high-frequency side. In the attenuation circuit 150 (the inductor L2 and the capacitor C2), which is of the LPF type, in contrast, the connection between the inductor L2 and the capacitor C2 permits a larger movement (change) of the impedance on the high-frequency side than the impedance on the low-frequency side. In the matching circuit 120, a combination of the circuit with a larger movement (change) on the high-frequency side (the attenuation circuit 150) and the circuit of the HPF type (the HPF 160) with a larger movement (change) on the low-frequency side enables the movements of the impedance to be canceled since the change of the impedance on the HPF side and the change of the impedance on the LPF side are opposite. Thus, the impedance on the low-frequency side and the impedance on the high-frequency side are combined together into a specific impedance. In contrast, in the matching circuit 210 in the first comparative example 200, the attenuation circuits 150 and 220 are of the LPF type, and the impedance on the high-frequency side changes largely. Thus, compared with the matching circuit 120 of the power amplifier module 100, due to their frequency characteristics, the impedance on the low-frequency side and the impedance on the high-frequency side are difficult to combine together into a specific impedance. Therefore, the matching circuit 120, which is constituted by the circuit of the LPF type (the attenuation circuit 150) and the circuit of the HPF type (the HPF 160), makes wider-band impedance matching of the power amplifier module 100 feasible.

Figure 4A:
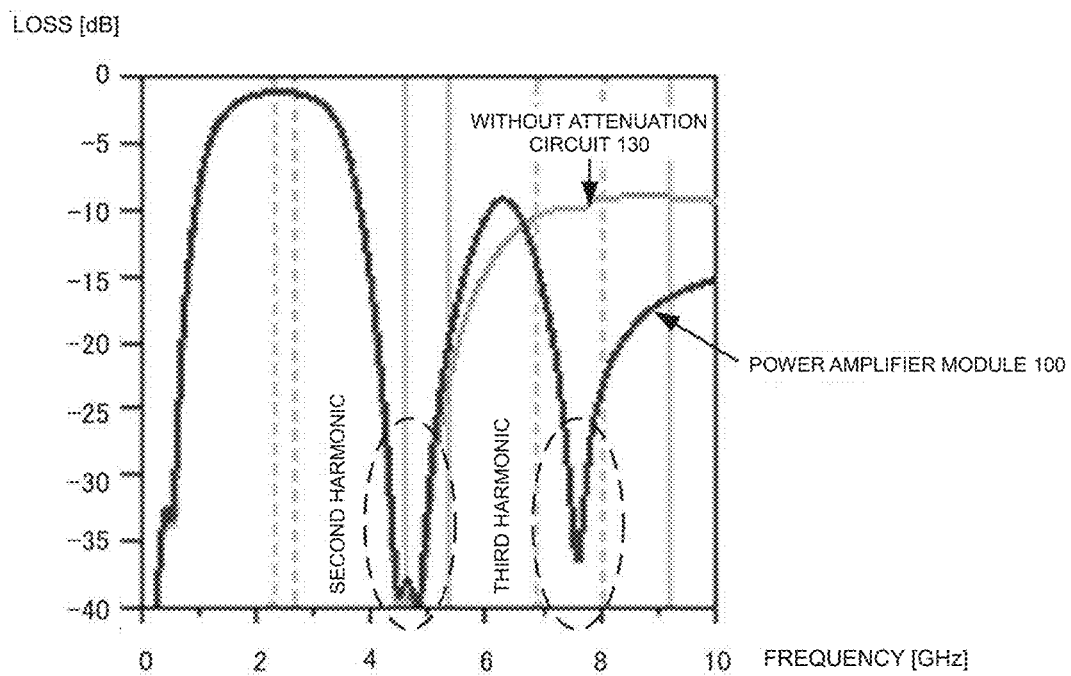
FIG. 4A illustrates a simulation result of signal loss in the power amplifier module illustrated in FIG. 1.

FIG. 4A illustrates a simulation result of signal loss within the power amplifier module 100. In FIG. 4A, the horizontal axis represents the frequency (GHz) of the RF signal RFin and the vertical axis represents signal loss (dB) within the power amplifier module 100. In this simulation, the carrier frequency band (the band of the fundamental frequency of the carrier wave) is set to be within a range of 2.3 to 2.7 GHz. In FIG. 4A, signal loss within a configuration in which the attenuation circuit 130 is excluded from the power amplifier module 100 is also illustrated for comparison. As illustrated in FIG. 4A, it is found that the power amplifier module 100, which includes the attenuation circuit 130, enables the third harmonic to be attenuated in addition to the second harmonic.

Figure 4B:
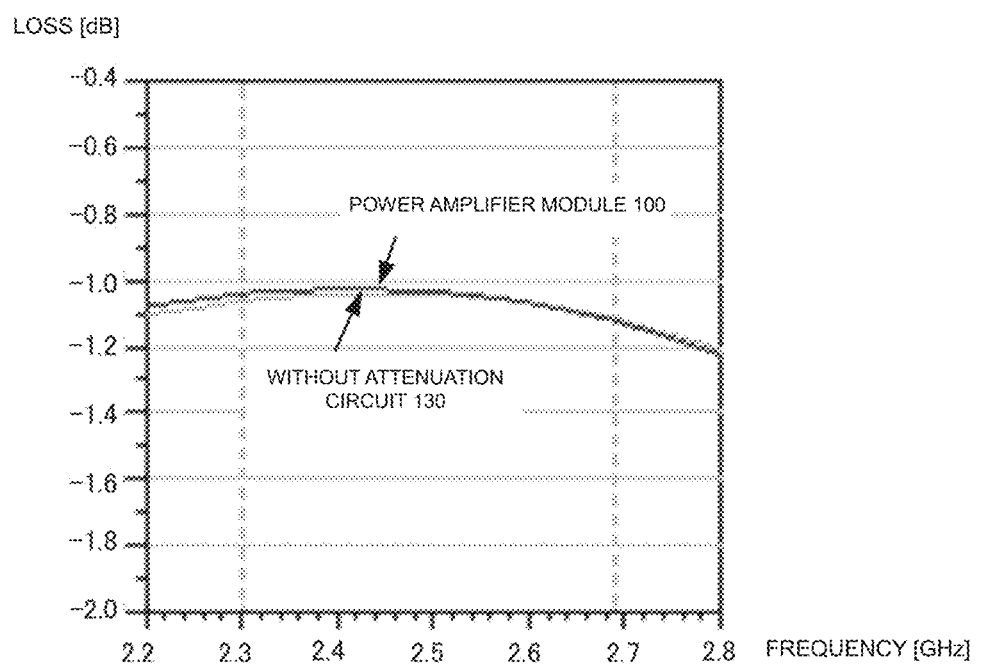
FIG. 4B illustrates an enlarged version of a carrier frequency band in simulation results illustrated in FIG. 4A.

FIG. 4B illustrates an enlarged version of the carrier frequency band (2.3 to 2.7 GHz) in the simulation results illustrated in FIG. 4A. As illustrated in FIG. 4B, it is found that, within the power amplifier module 100, signal loss over the carrier frequency band is substantially equivalent to that within the configuration that does not include the attenuation circuit 130.

Also from the simulation results illustrated in FIG. 4A and FIG. 4B, it is found that it is possible for the power amplifier module 100 to attenuate harmonic components and to eliminate or reduce the loss of a fundamental component.

Figure 5:
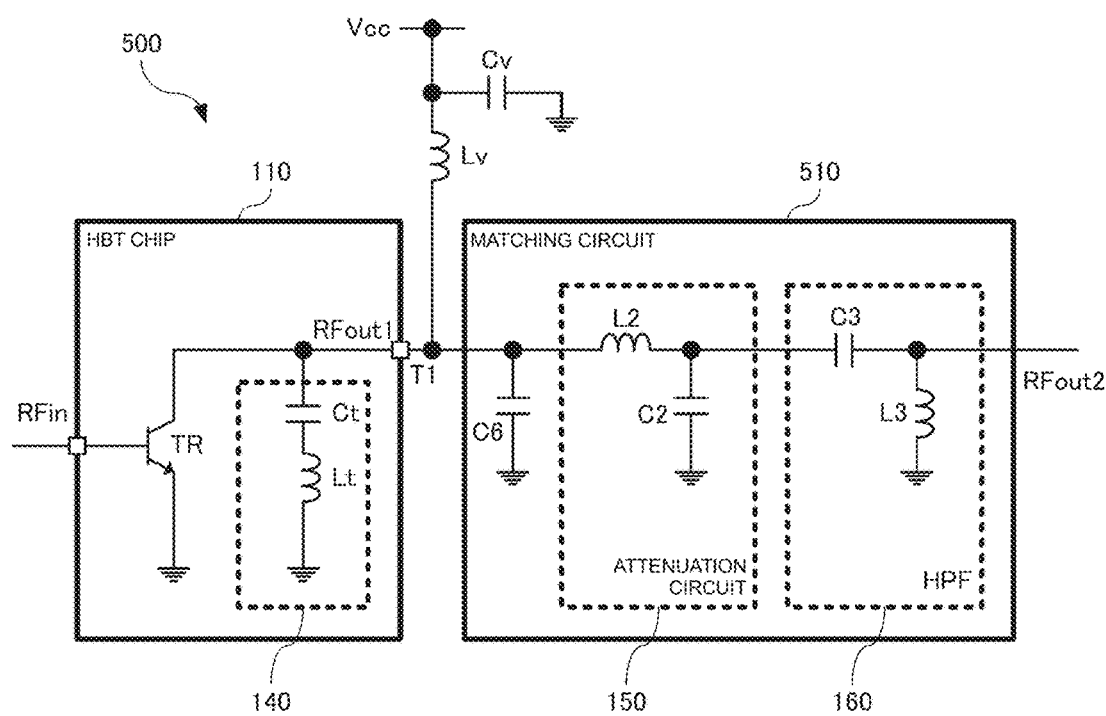
FIG. 5 illustrates a configuration of a power amplifier module according to a second comparative example.

FIG. 5 illustrates a configuration of a power amplifier module 500 according to a second comparative example (hereinafter referred to as the second comparative example 500) for comparison with the power amplifier module 100. Elements equivalent to those of the power amplifier module 100 are assigned equivalent numerals and are not described herein. The second comparative example 500 does not include the attenuation circuit 130 of the power amplifier module 100. The second comparative example 500 includes a matching circuit 510 in place of the matching circuit 120 of the power amplifier module 100. The matching circuit 510 further includes a capacitor C6 in addition to the attenuation circuit 150 and the HPF 160 in the matching circuit 120 of the power amplifier module 100.

The capacitor C6 attenuates a harmonic component (for example, the third harmonic) included in the amplified signal RFout1. The capacitor C6 has one end connected to the terminal T1 of the HBT chip 110, and another end grounded.

Figure 6A:
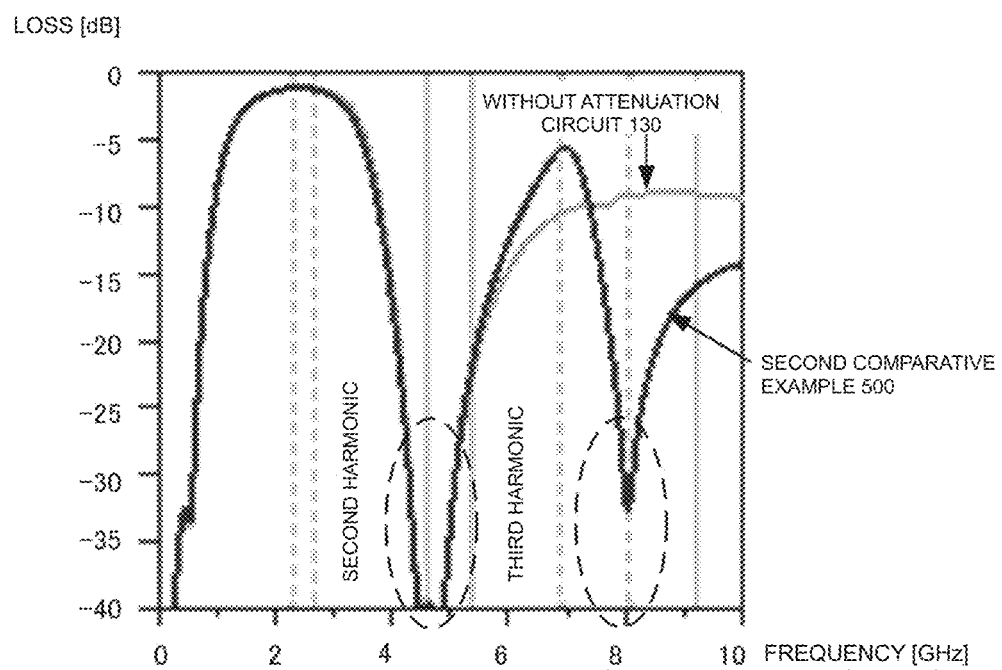
FIG. 6A illustrates a simulation result of signal loss in the second comparative example.

FIG. 6A illustrates a simulation result of signal loss within the second comparative example 500. In FIG. 6A, the horizontal axis represents the frequency (GHz) of the RF signal RFin and the vertical axis represents signal loss (dB) within the second comparative example 500. In this simulation, the carrier frequency band (the band of the fundamental frequency of the carrier wave) is set to be within a range of 2.3 to 2.7 GHz. In FIG. 6A, signal loss within a configuration in which the attenuation circuit 130 is excluded from the power amplifier module 100 is also illustrated for comparison. As illustrated in FIG. 6A, it is found that the second comparative example 500, which includes the capacitor C6, enables the third harmonic to be attenuated in addition to the second harmonic.

Figure 6B:
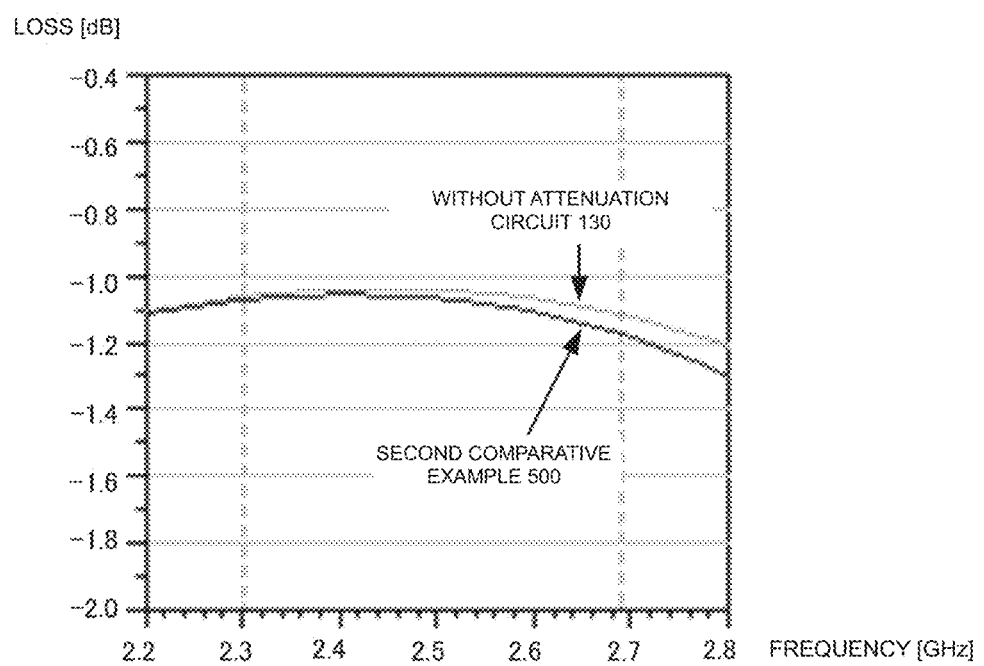
FIG. 6B illustrates an enlarged version of a carrier frequency band in simulation results illustrated in FIG. 6A.

FIG. 6B illustrates an enlarged version of the carrier frequency band (2.3 to 2.7 GHz) in the simulation results illustrated in FIG. 6A. As illustrated in FIG. 6B, it is found that, within the second comparative example 500, signal loss over the carrier frequency band is greater than that within the configuration that does not include the attenuation circuit 130.

The simulation results illustrated in FIG. 6A and FIG. 6B show that while the second comparative example 500 enables the third harmonic to be attenuated in addition to the second harmonic, the loss of a fundamental component increases. Therefore, also from these simulation results, it is found that it is possible for the power amplifier module 100 to attenuate harmonic components and to eliminate or reduce the loss of a fundamental component, compared with the second comparative example 500.

Figure 7:
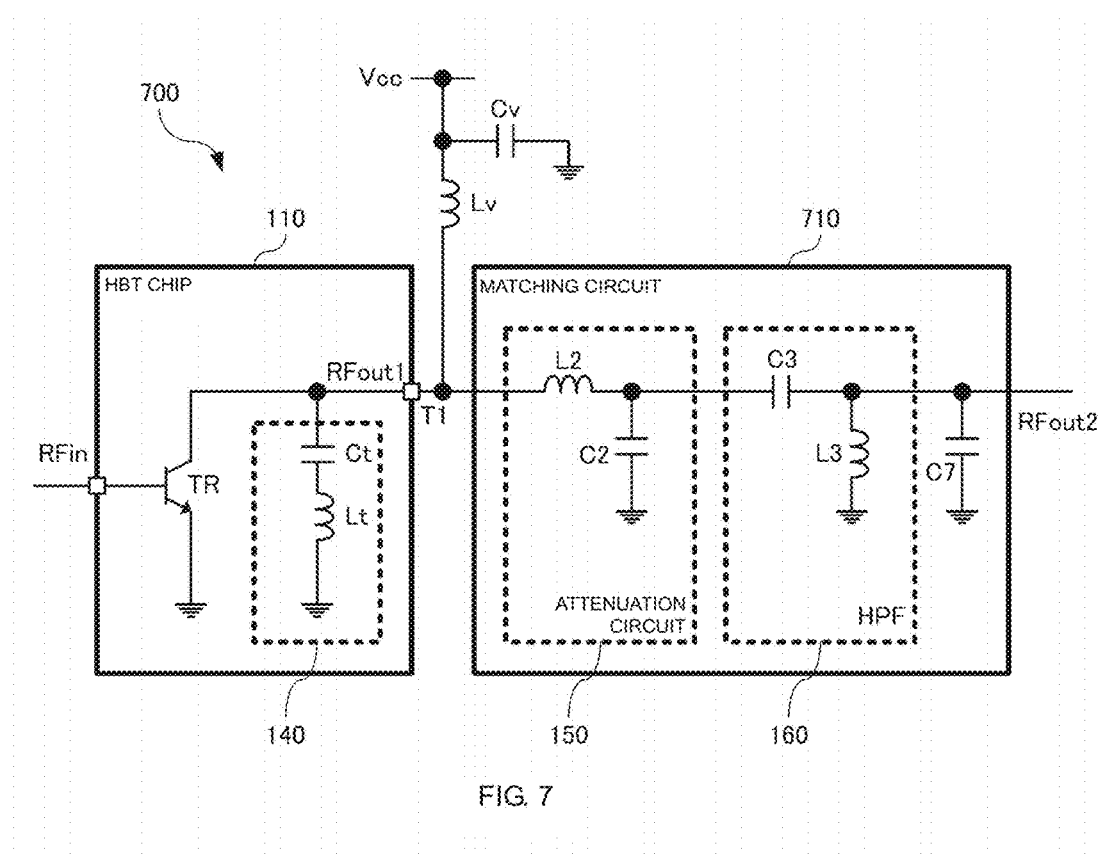
FIG. 7 illustrates a configuration of a power amplifier module according to a third comparative example.

FIG. 7 illustrates a configuration of a power amplifier module 700 according to a third comparative example (hereinafter referred to as the third comparative example 700) for comparison with the power amplifier module 100. Elements equivalent to those of the power amplifier module 100 are assigned equivalent numerals and are not described herein. The third comparative example 700 does not include the attenuation circuit 130 of the power amplifier module 100. The third comparative example 700 includes a matching circuit 710 in place of the matching circuit 120 of the power amplifier module 100. The matching circuit 710 further includes a capacitor C7 in addition to the attenuation circuit 150 and the HPF 160 in the matching circuit 120 of the power amplifier module 100.

The capacitor C7 attenuates a harmonic component (for example, the third harmonic) included in the amplified signal RFout1. The capacitor C7 has one end connected to the other end of the capacitor C3, and another end grounded.

Figure 8A:
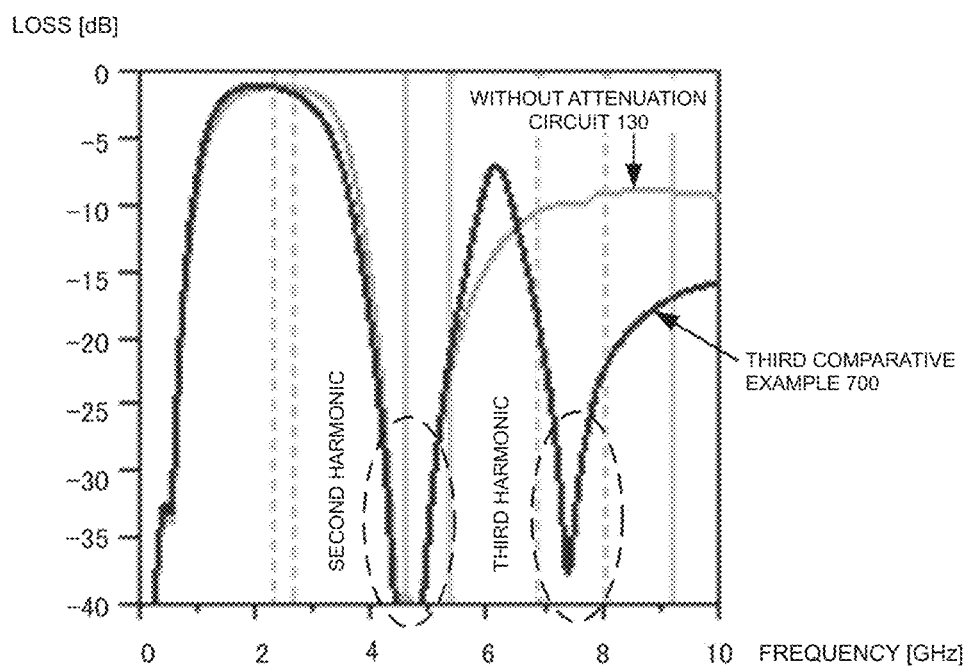
FIG. 8A illustrates a simulation result of signal loss in the third comparative example.

FIG. 8A illustrates a simulation result of signal loss within the third comparative example 700. In FIG. 8A, the horizontal axis represents the frequency (GHz) of the RF signal RFin and the vertical axis represents signal loss (dB) within the third comparative example 700. In this simulation, the carrier frequency band (the band of the fundamental frequency of the carrier wave) is set to be within a range of 2.3 to 2.7 GHz. In FIG. 8A, signal loss within a configuration in which the attenuation circuit 130 is excluded from the power amplifier module 100 is also illustrated for comparison. As illustrated in FIG. 8A, it is found that the third comparative example 700, which includes the capacitor C7, enables the third harmonic to be attenuated in addition to the second harmonic.

Figure 8B:
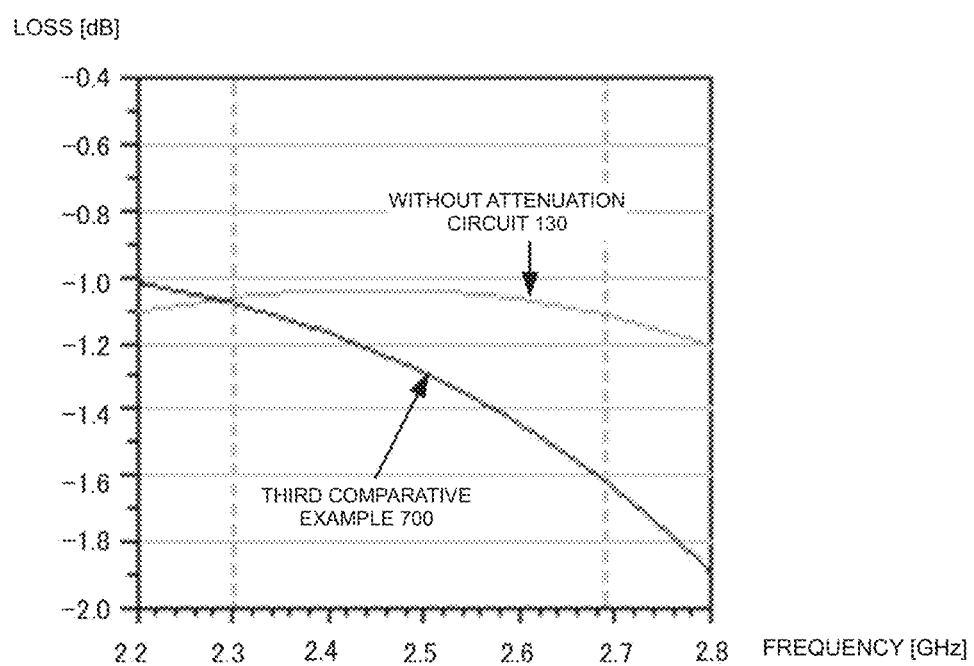
FIG. 8B illustrates an enlarged version of a carrier frequency band in simulation results illustrated in FIG. 8A.

FIG. 8B illustrates an enlarged version of the carrier frequency band (2.3 to 2.7 GHz) in the simulation results illustrated in FIG. 8A. As illustrated in FIG. 8B, it is found that, within the third comparative example 700, signal loss over the carrier frequency band is greater than that within the configuration that does not include the attenuation circuit 130.

The simulation results illustrated in FIG. 8A and FIG. 8B show that while the third comparative example 700 enables the third harmonic to be attenuated in addition to the second harmonic, the loss of a fundamental component increases. Therefore, also from these simulation results, it is found that it is possible for the power amplifier module 100 to attenuate harmonic components and to eliminate or reduce the loss of a fundamental component, compared with the third comparative example 700.

Figure 9:
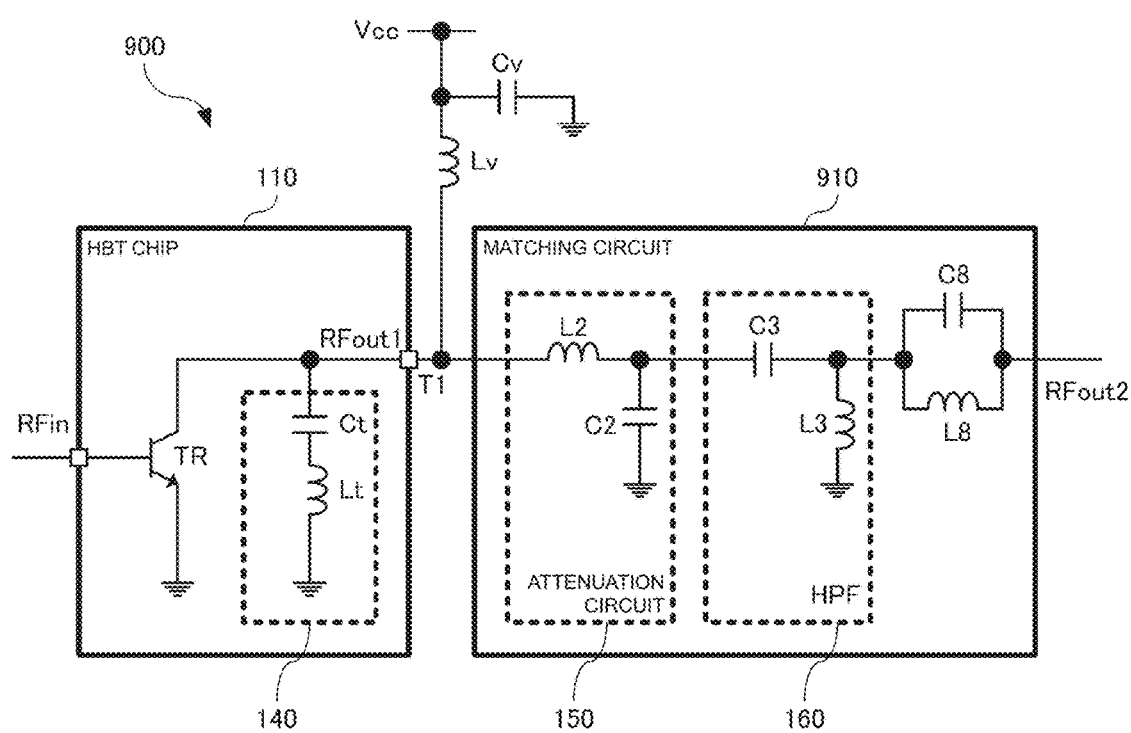
FIG. 9 illustrates a configuration of a power amplifier module according to a fourth comparative example.

FIG. 9 illustrates a configuration of a power amplifier module 900 according to a fourth comparative example (hereinafter referred to as the fourth comparative example 900) for comparison with the power amplifier module 100. Elements equivalent to those of the power amplifier module 100 are assigned equivalent numerals and are not described herein. The fourth comparative example 900 does not include the attenuation circuit 130 of the power amplifier module 100. The fourth comparative example 900 includes a matching circuit 910 in place of the matching circuit 120 of the power amplifier module 100. The matching circuit 910 further includes a capacitor C8 and an inductor L8 in addition to the attenuation circuit 150 and the HPF 160 in the matching circuit 120 of the power amplifier module 100.

The capacitor C8 and the inductor L8 constitute a parallel-connected tank circuit. The tank circuit attenuates a harmonic component (for example, the third harmonic) included in the amplified signal RFout1. The tank circuit has one end connected to the other end of the capacitor C3, and another end from which the amplified signal RFout2 is output.

Figure 10A:
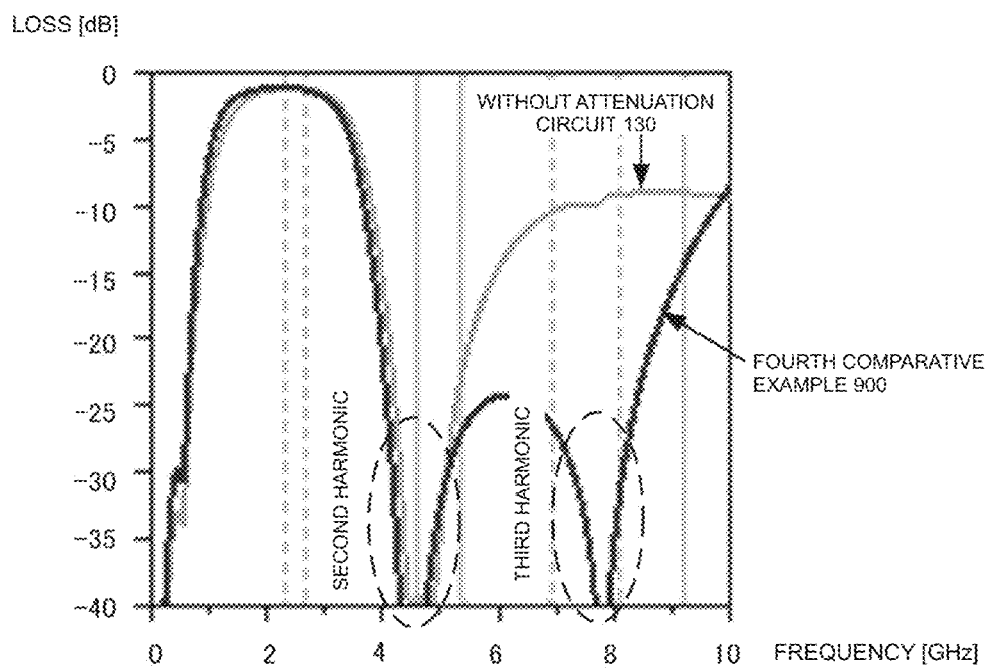
FIG. 10A illustrates a simulation result of signal loss in the fourth comparative example.

FIG. 10A illustrates a simulation result of signal loss within the fourth comparative example 900. In FIG. 10A, the horizontal axis represents the frequency (GHz) of the RF signal RFin and the vertical axis represents signal loss (dB) within the fourth comparative example 900. In this simulation, the carrier frequency band (the band of the fundamental frequency of the carrier wave) is set to be within a range of 2.3 to 2.7 GHz. In FIG. 10A, signal loss within a configuration in which the attenuation circuit 130 is excluded from the power amplifier module 100 is also illustrated for comparison. As illustrated in FIG. 10A, it is found that the fourth comparative example 900, which includes the capacitor C8 and the inductor L8, enables the third harmonic to be attenuated in addition to the second harmonic.

Figure 10B:
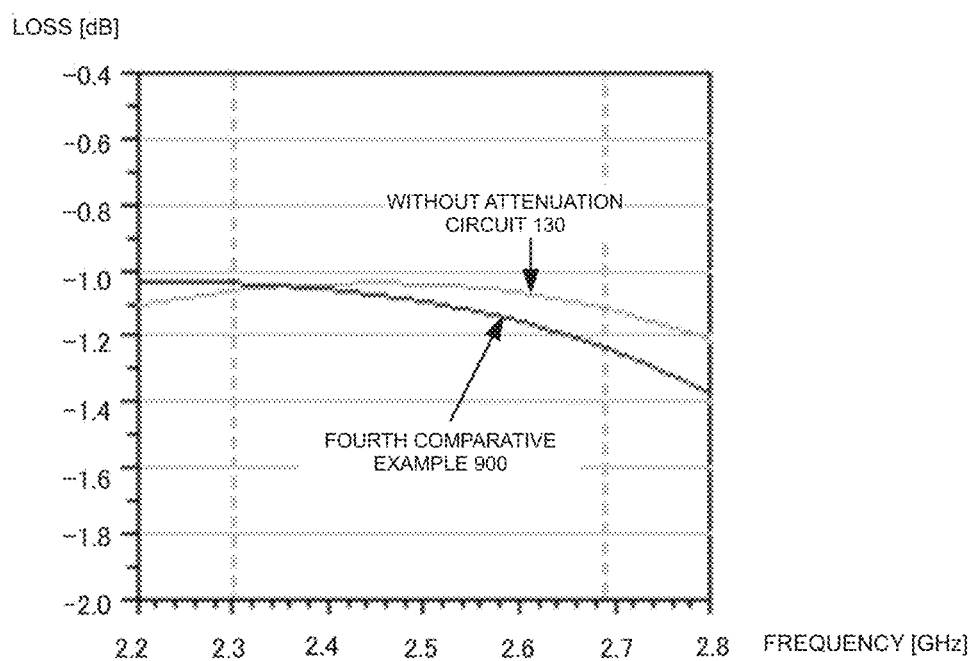
FIG. 10B illustrates an enlarged version of a carrier frequency band in simulation results illustrated in FIG. 10A.

FIG. 10B illustrates an enlarged version of the carrier frequency band (2.3 to 2.7 GHz) in the simulation results illustrated in FIG. 10A. As illustrated in FIG. 10B, it is found that, within the fourth comparative example 900, signal loss over the carrier frequency band is greater than that within the configuration that does not include the attenuation circuit 130.

The simulation results illustrated in FIG. 10A and FIG. 10B show that while the fourth comparative example 900 enables the third harmonic to be attenuated in addition to the second harmonic, the loss of a fundamental component increases. Therefore, also from these simulation results, it is found that it is possible for the power amplifier module 100 to attenuate harmonic components and to eliminate or reduce the loss of a fundamental component, compared with the fourth comparative example 900.

Figure 11:
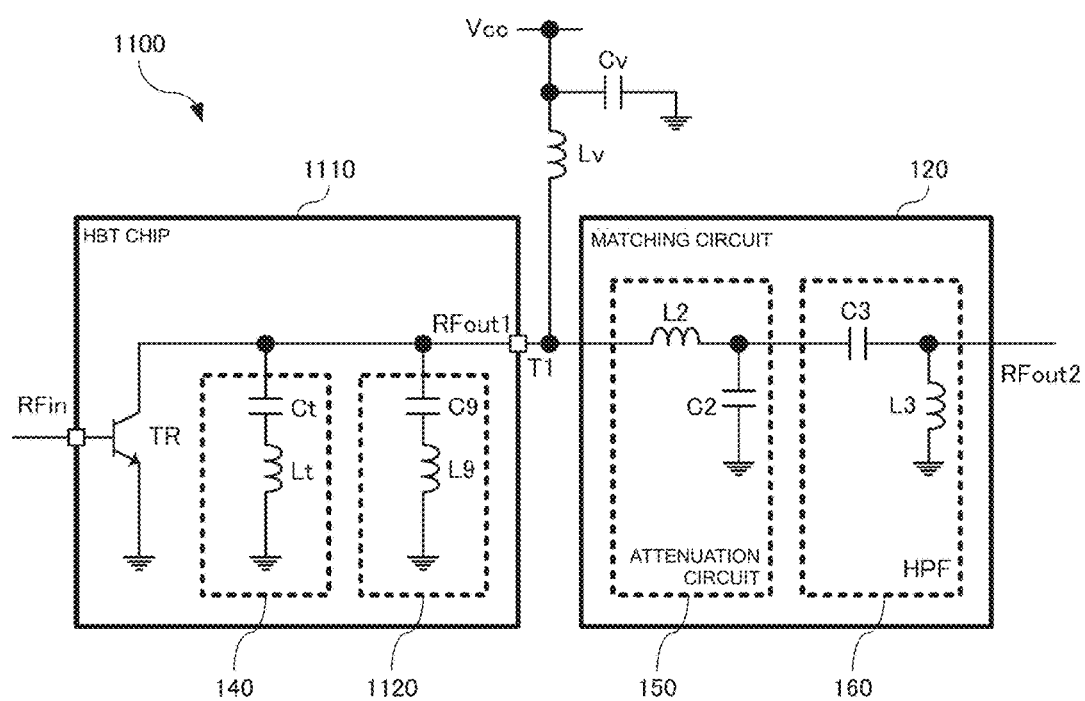
FIG. 11 illustrates a configuration of a power amplifier module according to a fifth comparative example.

FIG. 11 illustrates a configuration of a power amplifier module 1100 according to a fifth comparative example (hereinafter referred to as the fifth comparative example 1100) for comparison with the power amplifier module 100. Elements equivalent to those of the power amplifier module 100 are assigned equivalent numerals and are not described herein. The fifth comparative example 1100 does not include the attenuation circuit 130 of the power amplifier module 100. The fifth comparative example 1100 includes an HBT chip 1110 in place of the HBT chip 110 of the power amplifier module 100. The HBT chip 1110 includes a harmonic termination circuit 1120 in addition to the transistor TR and the harmonic termination circuit 140 on the HBT chip 110 of the power amplifier module 100.

The harmonic termination circuit 1120 attenuates a harmonic component (for example, the third harmonic) included in the amplified signal RFout1. The harmonic termination circuit 1120 includes, for example, a capacitor C9 and an inductor L9, which are connected in series. As illustrated in FIG. 11, the harmonic termination circuit 1120 has one end connected to the collector of the transistor TR, and another end grounded.

Figure 12:
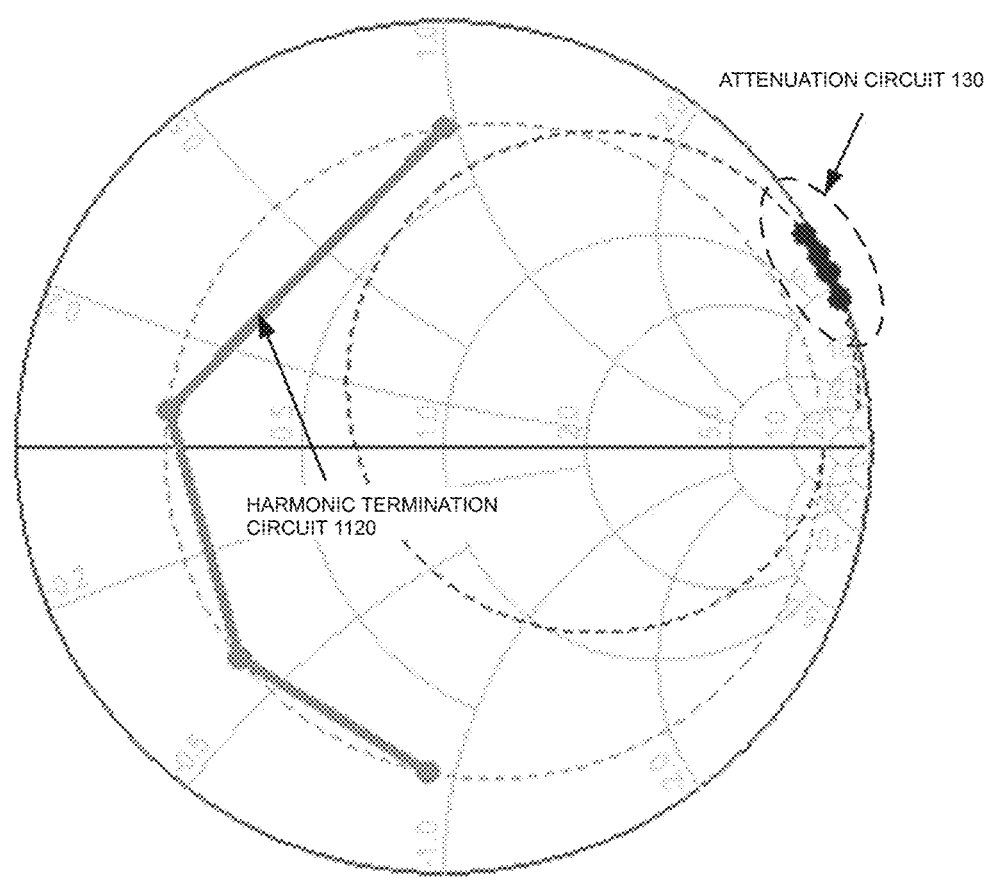
FIG. 12 illustrates impedance loci in an attenuation circuit and a harmonic termination circuit.

FIG. 12 illustrates the loci of the impedance of a harmonic (for example, the third harmonic) in the attenuation circuit 130 and the harmonic termination circuit 1120. In the power amplifier module 100, external wiring of the HBT chip 110 is present between the terminal T1 of the HBT chip 110 and the inductor L1 of the attenuation circuit 130. This wiring is longer than internal wiring of the HBT chip 110 and has a comparatively large parasitic inductance. As illustrated in FIG. 12, in the attenuation circuit 130 of the power amplifier module 100, due to this parasitic inductance, the impedance of a harmonic (for example, the third harmonic) when a resonance point is set at the frequency band of the harmonic (for example, the third harmonic) is adjusted to achieve the open condition. In the fifth comparative example 1100, in contrast, since the harmonic termination circuit 1120 is included in the HBT chip 1110, the wiring has a very small parasitic capacitance and a very small parasitic inductance. In the fifth comparative example 1100, therefore, as illustrated in FIG. 12, the locus of the impedance of a harmonic (for example, the third harmonic) changes and it is difficult to adjust the impedance of the harmonic (for example, the third harmonic) to achieve the open condition. In the power amplifier module 100, accordingly, the attenuation circuit 130 disposed between the HBT chip 110 and the choke inductor Lv enables the impedance of the harmonic component to be set to the open condition.

Here, the impedance at the attenuation frequency (for example, the second harmonic) of the harmonic termination circuit 140 is set to the short condition and the impedance at the attenuation frequency (for example, the third harmonic)

of the attenuation circuit 130 is set to the open condition, thereby making operation of a class-F amplifier feasible.

An embodiment of the present disclosure has been described. In the power amplifier module 100, the attenuation circuit 130 is disposed between the output terminal of the transistor TR and the choke inductor Lv. This configuration allows the power amplifier module 100 to attenuate a harmonic component of the amplified signal RFout1. In addition, the power amplifier module 100 can eliminate or reduce the loss of a fundamental component, compared with a configuration in which a harmonic termination circuit for attenuating a harmonic component (for example, the third harmonic) is disposed in the matching circuit 120.

In the power amplifier module 100, furthermore, the matching circuit 120 includes the attenuation circuit 150 that attenuates the second harmonic of the amplified signal RFout1. This configuration allows the power amplifier module 100 to attenuate the third harmonic by using the attenuation circuit 130 and to attenuate the second harmonic by using the attenuation circuit 150.

In the power amplifier module 100, furthermore, the matching circuit 120 may further include the HPF 160 that has a cutoff frequency lower than the fundamental frequency of the amplified signal RFout1.

In the power amplifier module 100, furthermore, the HBT chip 110 includes the harmonic termination circuit 140 that attenuates the second harmonic. This configuration allows the second harmonic having high energy to be effectively attenuated at a position close to the collector (output terminal) of the transistor TR.

In the power amplifier module 100, furthermore, the transistor TR is defined on the HBT chip 110, whereas the matching circuit 120, the choke inductor Lv, and the attenuation circuit 130 are located outside the HBT chip 110. Thus, as illustrated in FIG. 12, due to the influence of the parasitic inductance of wiring from the terminal T1 of the HBT chip 110 to the inductor L1, the impedance of a harmonic (for example, the third harmonic) when a resonance point is set at the frequency band of the harmonic (for example, the third harmonic) can be adjusted to achieve the open condition (class-F). This configuration enables the power amplifier module 100 to perform a class-F operation.

The embodiment described above is intended for easy understanding of the present disclosure, and it is not intended to construe the present disclosure in a limiting fashion. Various modifications and improvements can be made to the present disclosure without departing from the gist of the present disclosure, and equivalents thereof are also included in the present disclosure. That is, the embodiment may be appropriately modified in design by those skilled in the art, and such modifications also fall within the scope of the present disclosure so long as the modifications include the features of the present disclosure. For example, the elements included in the embodiment and the arrangement, materials, conditions, shapes, sizes, and the like thereof are not limited to those described in the illustrated examples but can be modified as appropriate. In addition, the elements included in the embodiment can be combined as much as technically possible, and such combinations of elements also fall within the scope of the present disclosure so long as the combinations of elements include the features of the present disclosure.

While preferred embodiments of the disclosure have been described above, it is to be understood that variations and modifications will be apparent to those skilled in the art without departing from the scope and spirit of the disclosure.

The scope of the invention, therefore, is to be determined solely by the following claims.

What is claimed is:

1. A power amplifier module comprising:
    an amplifier that amplifies an input signal and outputs an amplified signal from an output terminal;
    a matching circuit disposed between the output terminal of the amplifier and a subsequent circuit;
    a choke inductor, wherein a power supply voltage is applied to a first end of the choke inductor; and
    a first attenuation circuit disposed between the output terminal of the amplifier and a second end of the choke inductor, the first attenuation circuit attenuating a second harmonic of the amplified signal, wherein:
    the first attenuation circuit includes:
        a first inductor, wherein a first end of the first inductor is connected to the output terminal of the amplifier and a second end of the first inductor is connected to the second end of the choke inductor, and
        a first capacitor, wherein a first end of the first capacitor is connected to the second end of the first inductor and a second end of the first capacitor is grounded,
    the matching circuit includes:
        a second attenuation circuit that attenuates frequencies greater than a fundamental frequency of the amplified signal; and
        a filter, and
    the second attenuation circuit is a low pass filter including:
        a second inductor, wherein a first end of the second inductor is connected to the output terminal of the amplifier and a second end of the second inductor is connected to the filter, and
        a second capacitor, wherein a first end of the second capacitor is connected to a second end of the second inductor and a second end of the second capacitor is grounded.

2. A power amplifier module comprising:
    an amplifier that amplifies an input signal and outputs an amplified signal from an output terminal;
    a matching circuit disposed between the output terminal of the amplifier and a subsequent circuit;
    a choke inductor, wherein a power supply voltage is applied to a first end of the choke inductor; and
    a first attenuation circuit disposed between the output terminal of the amplifier and a second end of the choke inductor, the first attenuation circuit attenuating a third harmonic of the amplified signal, wherein:
    the first attenuation circuit includes:
        a first inductor, wherein a first end of the first inductor is connected to the output terminal of the amplifier and a second end of the first inductor is connected to the second end of the choke inductor, and
        a first capacitor, wherein a first end of the first capacitor is connected to the second end of the first inductor and a second end of the first capacitor is grounded,
    the matching circuit includes:
        a second attenuation circuit that attenuates frequencies greater than a fundamental frequency of the amplified signal; and
        a high-pass filter having a cutoff frequency lower than the fundamental frequency of the amplified signal, and
    the second attenuation circuit is a low pass filter including:
        a second inductor, wherein a first end of the second inductor is connected to the output terminal of the amplifier and a second end of the second inductor is connected to the high-pass filter, and
a second capacitor, wherein a first end of the second capacitor is connected to a second end of the second inductor and a second end of the second capacitor is grounded.

3. The power amplifier module according to claim 1, wherein the amplifier is embodied on a first chip, and wherein the matching circuit, the choke inductor, and the first attenuation circuit are not embodied on the first chip.

4. The power amplifier module according to claim 2, wherein the amplifier is embodied on a first chip, and wherein the matching circuit, the choke inductor, and the first attenuation circuit are not embodied on the first chip.

5. The power amplifier module according to claim 3, further comprising:
a third attenuation circuit that attenuates a third harmonic of the amplified signal,
wherein the third attenuation circuit is embodied on the first chip.

6. The power amplifier module according to claim 4, further comprising:
a third attenuation circuit that attenuates a second harmonic of the amplified signal,
wherein the third attenuation circuit is embodied on the first chip.

7. The power amplifier module according to claim 1, further comprising:
a third attenuation circuit that attenuates a third harmonic of the amplified signal.

8. The power amplifier module according to claim 2, further comprising:
a third attenuation circuit that attenuates a second harmonic of the amplified signal.

9. The power amplifier module according to claim 7, wherein the third attenuation circuit comprises a capacitor and an inductor connected in series between the output terminal of the amplifier and ground.

10. The power amplifier module according to claim 8, wherein the third attenuation circuit comprises a capacitor and an inductor connected in series between the output terminal of the amplifier and ground.

* * * * *